US007248336B2

(12) United States Patent
Nelson et al.

(10) Patent No.: US 7,248,336 B2
(45) Date of Patent: *Jul. 24, 2007

(54) METHOD AND SYSTEM FOR IMPROVING FOCUS ACCURACY IN A LITHOGRAPHY SYSTEM

(75) Inventors: Michael L. Nelson, West Redding, CT (US); Justin L. Kreuzer, Trumbull, CT (US); Peter L. Filosi, Bethel, CT (US); Christopher J. Mason, Newtown, CT (US)

(73) Assignee: ASML Holding N.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 11/408,956

(22) Filed: Apr. 24, 2006

(65) Prior Publication Data

US 2006/0187436 A1    Aug. 24, 2006

Related U.S. Application Data

(63) Continuation of application No. 11/050,694, filed on Feb. 7, 2005, now Pat. No. 7,053,984, which is a continuation of application No. 09/841,187, filed on Apr. 25, 2001, now Pat. No. 6,859,260.

(51) Int. Cl.
*G03B 27/72* (2006.01)
*G03B 27/42* (2006.01)
*G03B 27/32* (2006.01)

(52) U.S. Cl. .............................. 355/55; 355/53; 355/77
(58) Field of Classification Search .................. 355/53, 355/55, 72, 77; 250/492.2
See application file for complete search history.

(56) References Cited

U.S. PATENT DOCUMENTS

| 5,883,703 | A | 3/1999 | Knirck et al. |
| 6,208,407 | B1 | 3/2001 | Loopstra |
| 6,341,007 | B1 | 1/2002 | Nishi et al. |
| 6,509,957 | B1 | 1/2003 | Tanaka |
| 6,859,260 | B2 | 2/2005 | Nelson et al. |
| 7,053,984 | B2 * | 5/2006 | Nelson et al. ................ 355/55 |

FOREIGN PATENT DOCUMENTS

| EP | 1 037 117 A2 | 9/2000 |
| EP | 1 037 117 A3 | 11/2003 |
| JP | 61-196532 | * 9/1986 |

OTHER PUBLICATIONS

European Search Report for corresponding European application No. 02009481.9-2222, dated Sep. 20, 2005.
English-language abstract of Japanese Publication No. 61 196532, published Aug. 30, 1986.
Advanced Focus System Development Task Proposal Submitted in response to Advance Lithography SOL BAA 99-14, Mar. 2, 1999, pp. 1-34, Silicon Valley Group, Inc. Lithography Division.

* cited by examiner

*Primary Examiner*—Alan Mathews
(74) *Attorney, Agent, or Firm*—Sterne, Kessler, Goldstein & Fox, P.L.L.C.

(57) ABSTRACT

A focus system that includes a calibration subsystem and a control subsystem. The control subsystem, which includes a control sensor, is in close proximity to the exposing of an image. The calibration subsystem, which includes a calibration sensor and a control sensor, is located remotely from, or off-axis with respect to, the exposing of an image. By separating calibration and control functions, the functional requirements can be separated into two (or more) types of sensors.

20 Claims, 4 Drawing Sheets

| X/Y Coordinates | Calibration Sensor Value (optional) | Control Sensor A Value | Control Sensor B Value | ... | Control Sensor N Value |
|---|---|---|---|---|---|
| $X_1/Y_1$ | $Calibration_{1,1}$ | $Control\ A_{1,1\ (i.e.,\ x=1,y=1)}$ | $Control\ B_{1,1}$ | | $Control\ N_{1,1}$ |
| $X_1/Y_2$ | $Calibration_{1,2}$ | $Control\ A_{1,2\ (i.e.,\ x=1,y=2)}$ | $Control\ B_{1,2}$ | | $Control\ N_{1,2}$ |
| $X_1/Y_3$ | $Calibration_{1,3}$ | $Control\ A_{1,3\ (i.e.,\ x=1,y=3)}$ | $Control\ B_{1,3}$ | | $Control\ N_{1,3}$ |
| .. | .. | .. | .. | | .. |
| $X_2/Y_1$ | $Calibration_{2,1}$ | $Control\ A_{2,1}$ | $Control\ B_{2,1}$ | | $Control\ N_{2,1}$ |
| $X_2/Y_2$ | $Calibration_{2,2}$ | $Control\ A_{2,2}$ | $Control\ B_{2,2}$ | | $Control\ N_{2,2}$ |
| $X_2/Y_3$ | $Calibration_{2,3}$ | $Control\ A_{2,3}$ | $Control\ B_{2,3}$ | | $Control\ N_{2,3}$ |
| .. | .. | .. | .. | | .. |
| $X_3/Y_1$ | $Calibration_{3,1}$ | $Control\ A_{3,1}$ | $Control\ B_{3,1}$ | | $Control\ N_{3,1}$ |
| $X_3/Y_2$ | $Calibration_{3,2}$ | $Control\ A_{3,2}$ | $Control\ B_{3,2}$ | | $Control\ N_{3,2}$ |
| $X_3/Y_3$ | $Calibration_{3,3}$ | $Control\ A_{3,3}$ | $Control\ B_{3,3}$ | | $Control\ N_{3,3}$ |
| .. | .. | .. | .. | | .. |
| .. | .. | .. | .. | | .. |

FIG. 4

METHOD AND SYSTEM FOR IMPROVING FOCUS ACCURACY IN A LITHOGRAPHY SYSTEM

CROSS REFERENCE TO RELATED APPLICATIONS

This application is a continuation of U.S. patent application Ser. No. 11/050,694, filed Feb. 7, 2005, now U.S. Pat. No. 7,053,984 which is a continuation of U.S. patent application Ser. No. 09/841,187, filed Apr. 25, 2001, now U.S. Pat. No. 6,859,260, issued Feb. 22, 2005, which is hereby incorporated by reference herein in its entirety.

BACKGROUND OF THE INVENTION

1. Field of the Invention

The present invention relates generally to lithography systems. More particularly, the present invention relates to sensors used for focusing in lithography systems.

2. Background Art

Lithography is a process used to create features on the surface of substrates. Such substrates can include those used in the manufacture of flat panel displays, circuit boards, various integrated circuits, and the like. A frequently used substrate for such applications is a semiconductor wafer. While this description is written in terms of a semiconductor wafer for illustrative purposes, one skilled in the art would recognize that this description also applies to other types of substrates known to those skilled in the art.

During lithography, a reticle is used to transfer a desired pattern onto a substrate, such as a wafer. Reticles may be formed of material(s) transparent to the lithographic wavelength used, for example glass in the case of visible light. In addition, reticles can also be formed of material(s) that reflect the lithographic wavelength chosen for the specific system in which it is used. An illumination source (e.g., exposure optics located within a lithographic apparatus) illuminates the reticle, which is disposed on a reticle stage. This illumination exposes an image onto the substrate that is disposed on a substrate stage. The image exposed onto the substrate corresponds to the image printed on the reticle. While exposure optics are used in the case of photolithography, a different type of exposure apparatus may be used depending on the particular application. For example, x-ray, ion, electron, or photon lithographies each may require a different exposure apparatus, as is known to those skilled in the art. The particular example of photolithography is discussed here for illustrative purposes only.

The projected image produces changes in the characteristics of a layer, for example photoresist, deposited on the surface of the substrate. These changes correspond to the features projected onto the substrate during exposure. Subsequent to exposure, the layer can be etched to produce a patterned layer. The pattern corresponds to those features projected onto the substrate during exposure. This patterned layer is then used to remove or further process exposed portions of underlying structural layers within the substrate, such as conductive, semiconductive, or insulative layers. This process is then repeated, together with other steps, until the desired features have been formed on the surface, or in various layers, of the substrate.

Step and scan technology works in conjunction with a projection optics system that has a narrow imaging slot. Rather than expose the entire substrate at one time, individual fields are scanned onto the substrate one at a time. This is done by moving the substrate and reticle simultaneously, albeit at different rates, such that the imaging slot is moved across the field during the scan. The substrate stage must then be asynchronously stepped between field exposures to allow multiple copies of the reticle pattern to be exposed over the substrate surface. In this manner, the quality of the image projected onto the wafer is maximized. While using a step-and-scan technique generally assists in improving overall image quality, image degradations generally occur in such systems due to imperfections, such as those within the projection optics system, illumination system, and the particular reticle being used.

An important aspect in lithography is maintaining uniformity in the size of the features created on the surface of substrates. Current requirements for variations in feature size (also known as critical dimension) are that they be less than approximately ±5% of nominal. This implies, for example, ±5 nm or less variations in critical dimension for 100 nm isolated lines, ±3.5 nm or less variations for 70 nm isolated lines, and ±1.5 nm for 30 nm isolated lines. Critical to achieving these levels of performance is the focus system.

Some current state of the art focus systems use capacitance gauge sensors. Focus sensor capacitance gauge metrology is based on the change in capacity of a plane parallel plate capacitor when the plate separation is changed. The capacity of a plane parallel plate capacitor with a small plate separation with respect to the plate diameter that is filled with uniform dielectric layers over a conductive substrate is inversely proportional to the plate separation. Such current state of the art focus systems can meet current lithography needs. However, the reduction of both random and systematic errors is required for next generation lithography use. Current random errors are of the order of 2 nm-rms (root mean squared) over the servo bandwidth. Current mean shifts, not related to wafer processing, are of the order of 25 nm. Current systematic errors can exceed 100 nm. Current wafer process errors can range from being negligible to over 100 nm.

Current understanding of these errors attributes the random errors to the capacitance gauge electronics. Mean shifts are attributed to systematic changes in the thickness or properties of layers underlying the resist. The wafer process errors are attributed to the wafer circuit layers and patterns. For a given integrated circuit, the wafer process errors are a systematic offset that is nominally the same for each field. Capacitance focus sensor readings are a function of the dielectric layers overlaying the conductors and the special distribution of the patterns. For example, a capacitance sensor will indicate a distance change when the wafer target changes from a large area dielectric film to a conductive film both on the same surface and of the same thickness. In addition, a capacitance gauge will give readings that are a function of conductor feature size for the same average conductor fill factor.

Accordingly, there is a need for improving focus systems so that they meet the requirements for next generation lithography use. More specifically, there is a need for improved focus systems that can be used to maintain uniformity in size of features created on the surface of substrates.

BRIEF SUMMARY OF THE INVENTION

The present invention is directed to a method and system for improving focus accuracy in a lithography system including a lens for exposing an image onto a top surface of a substrate.

According to an embodiment of the present invention, prior to positioning a specific region on the top surface of the substrate under the lens, a proper focus distance for the specific region is determined using a calibration sensor. The calibration sensor, which has an extremely high focus accuracy, is part of a calibration subsystem located remotely from, or off-axis with respect to, the exposing of an image. A first measurement relating to the specific region at the proper focus distance is then produced. The first measurement is produced using a secondary control sensor, which has a lower focus accuracy than the calibration sensor.

When it is time to actually expose the image onto the substrate, the specific region is positioned under the lens, which is part of a primary sensor system (also referred to as a control subsystem). While the specific region is positioned under the lens, a second measurement relating to the specific region is produce using a primary control sensor. The primary control sensor also has a lower focus accuracy than the calibration sensor. Preferably, the primary control sensor is substantially the same as the secondary control sensor. An actual focus distance is then adjusted based on the first and second measurements. Now that the focus distance has been accurately adjusted, a portion of an image is then exposed on the specific region.

Additional features and advantages of the present invention, as well as the structure and operation of various embodiments of the present invention, are described in detail below with reference to the accompanying drawings.

BRIEF DESCRIPTION OF THE DRAWINGS/FIGURES

The features, objects, and advantages of the present invention will become more apparent from the detailed description set fourth below when taken in conjunction with the drawings in which like reference characters identify corresponding elements throughout and wherein:

FIG. 4 shows an exemplary table that store measurements that are used to adjust focus distance, according to an embodiment of the present invention.

DETAILED DESCRIPTION OF THE INVENTION

Figure 1:
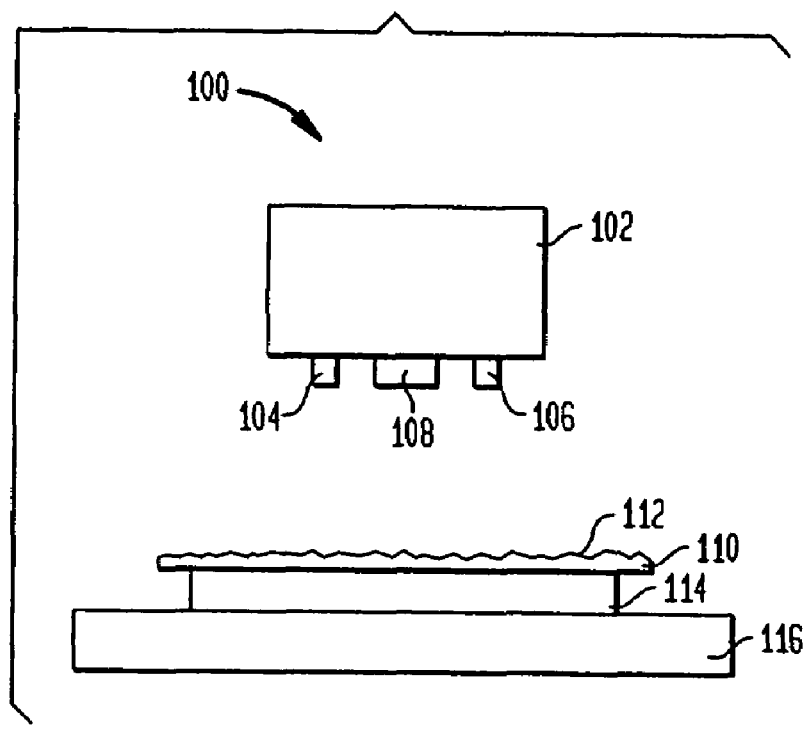
FIG. 1 is a functional block diagram of an exemplary focus system.

Lithography tools typically include a focus system that maintains the silicon wafer photoresist surface in the desired image plane (also called the focal plane) of the projection system. Such a focus system is typically a servo system that is made of components that can be categorized as: 1) elements that sense the position of a substrate surface; and 2) elements that perform actuation. The present invention relates to elements of a focus system that sense the position of a substrate surface.

Important performance requirements for the focus system relate to: focus accuracy and precision; bandwidth and start of scan time; dynamic and working range; thermal dissipation; linear range; and insensitivity to resist effects. Each of these performance requirements are described below. In these descriptions, it is assumed that the substrate is a wafer.

The present invention can be used to achieve the performance requirements necessary for next generation lithography use. However, the present invention does not require that each of the following performance requirements be satisfied. That is, the breadth and scope of the present invention should not be limited by the following discussion of performance requirements, but rather should be defined in accordance with the claims and their equivalents.

1. Description of Performance Requirements

A. Focus Accuracy and Precision

A focus system should accurately and precisely locate the top photoresist of a substrate, regardless of whether the substrate is located in air, gas, or a vacuum. Focus accuracy refers to the capability of the focus system to determine wafer plane focus with respect to the image focus plane. Precision refers to the ability to repeat a given focus measurement (i.e., repeatability of measurements).

Accuracy and precision of the focus system must be consistent with the critical dimension uniformity requirements for the lithography apparatus. Focus variation can result from various errors that can be classified into mean shift, systematic and random error sources. The further the distance from best focus the larger the variation in the critical dimension. Critical dimension uniformity of projection optics is a function of the projection optics and resist characteristics for a given feature type. A projection optic manufactured to design with no aberrations would be close to zero at best focus. By plotting critical dimension against range of focus, and examining the factors that contribute to mean shift, systematic and random errors, relationships between critical dimension and focus errors can be established. Focus error contributors include: the reticle stage, autocal errors, projection optics errors, focus control errors, wafer thickness errors, and measurement and tool setup. The reticle stage may cause focus errors due to reticle plane flatness errors, contamination between the reticle and the reticle plane, reticle stage position measurement errors, and thermally induced reticle position drift. Autocal errors include tool drift and autocal drift. Projection optic errors relate to astigmatism and field curvature. Focus control errors, which account for approximately 30% of the focus errors, relate to wafer chucking, backplane flatness, focus precision, focus offset and focus stability.

B. Bandwidth

Bandwidth is composed of two parts. One is the ability to respond to topography changes during a scan. The required bandwidth is proportional to the scan velocity of the illumination slot dimension in the scan direction. Typically this translates to 50 Hz. The other is the ability to settle out (start of scan time) when scanning onto a wafer edge, a situation that occurs multiple times during a typical wafer scan. During this transition, the focus system will normally be guided to a focus position just prior to passing onto the wafer, thus reducing the amount of focus adjustment required once the focus sensor(s) pass over the wafer surface. How quickly the focus system settles into the actual focus environment determines how much of the edge field scan will be "out of focus". Depending on scan speed, if it is desirable to keep the effected field distance below a millimeter, the bandwidth must be greater than 200 Hz.

C. Dynamic and Working Range

Focus system dynamic range is driven by wafer surface thickness variations and unit to unit deviation in lens-to-wafer position (±100 µm focus range), while the working range is on the order of ±20 µm.

D. Linear Range

Focus system linearity should not deviate by more than ±5 nm from a straight line or should be correctable to this level.

E. Thermal Dissipation

Thermal dissipation (also known as power dissipation) by the focus system, in the vicinity of the projection optics, should be kept much less than 0.1 watts.

F. Insensitivity to Wafer Processing and Resist Effects

The focus system should have minimal sensitivity to the current state of wafer processing-including patterning, film and resist layers.

2. Exemplary Focus system

FIG. 1 is a functional block diagram of an exemplary focus system 100 (also referred to as primary focus system 100) that uses closed loop servos to attempt to keep a wafer surface 112 of a wafer 110 at an actual focal plane of projection optics 102 during alignment and exposure operations. Wafer 110 is supported by a wafer chuck 114 on a wafer stage 116. In this exemplary system, control sensors 104 and 106 are located on either side of and in very close proximity to an exposing area 108 (e.g., an exposure slot, the exposure lens closest to the surface being exposed, or any other type of exposing area closest to the surface being exposed) of projection optics 110. Control sensors 104 and 106 (referred to collectively as a primary control sensor), can be, for example, capacitance gauges that measure the location of (e.g., distance to) wafer surface 112 of wafer 110. In such an embodiment, a focal plane (also referred to as a focus distance) can be estimated by, for example, averaging measurements made by control sensors 104 and 106. The use of two control sensors (e.g., sensors 104 and 106) supports two dimensional surface closed loops. If four control sensors are used, with two located on either side of exposing area 108, three dimensional surface closed loops can be supported. However, it is noted that the present invention can also cover situations where only one control sensor is used. For completeness, a wafer chuck 114 and a wafer stage 116, which are both used to maneuver wafer 110, are also shown. Wafer chuck 114 and wafer stage 116 are exemplary parts of a focus adjustor that maneuvers a substrate in relation to primary focus system 100.

Similar focus systems can be used in non-optical systems. For example, instead of projecting on optical beam, exposing area 108 can project an electron beam, e.g., in an X-ray lithography system. Alternatively, exposing area 108 can project a shadow, e.g., in a lithography system utilizing a contact print.

It is apparent from the above description that the estimated focal plane may be different from an actual focal plane due to wafer non-flatness. An object of the present invention is to minimize such wafer topography errors. More specifically, an object of the present invention is to correct wafer surface measurements, taken from one or more sensors located at a distance away from exposing area 108, to accurately match measurements that a sensor would make if it were located at exposing area 108.

Because the control sensors are located in very close proximity to the exposure area, the architecture shown in FIG. 1 has significant disadvantages because it requires the sensors 104 and 106 to be nearly ideal if they are to meet the requirements of next generation lithography systems. More specifically, to meet the requirements of next generation lithography system, sensors 104 and 106 must provide sufficiently accurate and precise focus, sufficiently high bandwidth, acceptable settle out characteristics, acceptable dynamic and working range characteristics, acceptable thermal dissipation, acceptable linear range, and sufficient insensitivity to resist effects. Accordingly, the imposed set of constraints for next generation lithography systems can be very difficult to achieve.

The present invention relieves sensors 104 and 106 of some of the above discussed requirements. This is accomplished by duplicating the primary focus system, but in place of exposure lens 108 (i.e., the lens of projection optics 102 that is closest to surface 112 of wafer 110) is one or more additional sensors that can be used to determine a focus error at the exposure area. This is explained in more detail below.

The functions performed by the primary control sensor (e.g., sensors 104 and 106) relate to active, on-line focusing control of exposure optics (i.e., lens 108) located in a lithographic system. Accordingly, the primary control sensor is located in close proximity to lens 108 of the lithography system. The primary control sensor requirements are therefore subject to tight space constraints. Limited physical space near the lens of a lithography system is always a challenge. In addition to focus sensors, a lithography system may require additional hardware, for example, to remove contamination outgasing from the resist. The outgasing products are typically removed to prevent contamination of the lens environment. Thus, it is important to limit the number of subsystems that must be packed into this very sensitive area of the lithography system (i.e., near lens 108).

There is the potential for any focus sensor to be sensitive to coatings, substrate material, pattern, and wafer topology. This is especially true for a capacitance gauge sensor. For example, a capacitance gauge sensor is susceptible to errors due to their sensitivity to substrate material. More specifically, the electrical conductivity and dielectric constant of the underlying substrate affects the capacitance gauge sensor's perception of surface location. This is referred to as pattern sensitivity.

Another obstacle to overcome is the spacial frequency of wafer topology. More specifically, the primary control sensor (e.g., sensor 104 and 106) must be able to follow the terrain of the wafer in real time and provide the data required to adjust the position of the wafer to keep it in focus. Thus, the focus system control subsystem must have sufficiently high bandwidth for real-time wafer surface control. That is, the primary control sensor requires high bandwidth because it is used as a feedback control device in a wafer stage servo loop (i.e., as a real-time control sensor).

Accordingly, the separating of control and calibration functions in accordance with the present invention relieves the primary control sensor of the requirement for complete process level insensitivity. Additionally, the separating of control and calibration functions relieves a calibration subsystem of the present invention (discussed below) of tight space constraints.

4. Calibration Subsystem

Figure 2:
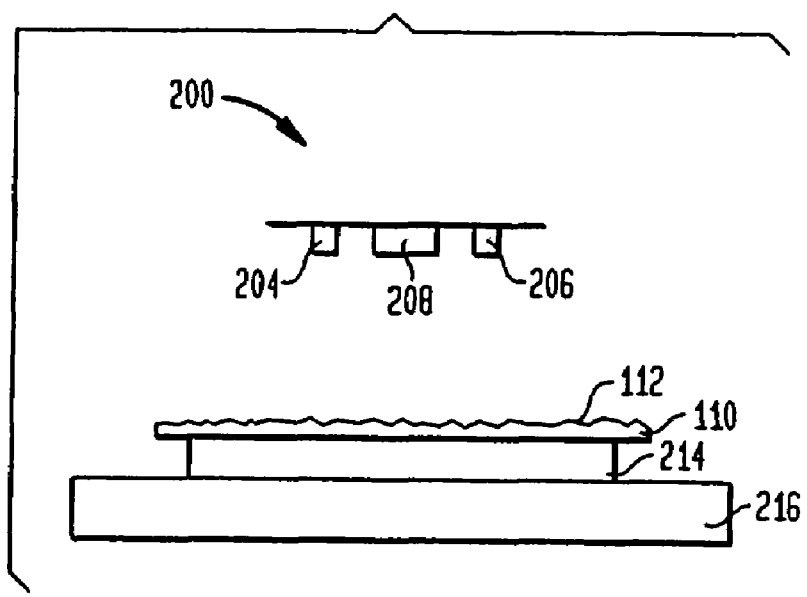
FIG. 2 is a functional block diagram of an exemplary focus sensor calibration subsystem, according to an embodiment of the present invention.

FIG. 2 is a functional block diagram of an exemplary focus sensor calibration subsystem 200 of the present invention (also referred to simply as, calibration subsystem 200). Calibration subsystem 200, which includes a calibration sensor, is located remotely from, or off-axis with respect to, lens 108. In other words, calibration subsystem 200 is located remote from lens 108, and thus located remote from primary focus system 100. In one embodiment, calibration subsystem 200 can be a stand alone system separate from a lithography system. Alternatively, calibration subsystem 200 can by part of a pre-alignment system of a lithography system. In another embodiment, calibration subsystem 200 can be located within the same chamber as, but remote from, lens 108.

The functions performed by calibration subsystem 200 relate to an absolute measurement of the location of (e.g., the distance to) a substrate's (e.g., wafer's) top surface. Since these functions are performed remotely from the exposing image, the focus sensor calibration subsystem requirements are independent of the characteristics of underlying process levels.

Accordingly, the separating of control and calibration functions effectively relaxes requirements of calibration subsystem 200 that relate to tight space constraints, high bandwidth, and operational environment. For example, in an embodiment of the present invention, calibration subsystem 200 can operate in an air environment even though the projection system (including lens 108) may require vacuum operation.

Calibration system 200 resembles primary focus system 100, except, in place of lens 108, is a calibration sensor 208. For example, control sensors 204 and 206 (referred to collectively as a secondary control sensor) are located on either side of and in very close proximity to calibration sensor 208.

More specifically, control sensors 204 and 206 should be arranged about calibration sensor 208 in the same manner as control sensors 104 and 106 are arranged about lens 108. Additionally, control sensors 204 and 206 are preferably the same type of sensors as control sensors 104 and 106. For example, if control sensors 104 and 106 of control subsystem 100 are capacitance gauges, then control sensors 204 and 206 of calibration subsystem 200 are preferably also capacitance gauges.

Thus, generally, the secondary control sensor (e.g., consisting of sensors 204 and 206) is preferably substantially the same as the primary control sensor (e.g., consisting of sensors 104 and 106). For completeness, a wafer chuck 214 and a wafer stage 216, which are both used to maneuver wafer 110 or other similar wafers, are also shown. In one embodiment, wafer chuck 214 is the same as wafer chuck 114, and wafer stage 216 is the same as wafer stage 116. Wafer chuck 214 and wafer stage 216 are exemplary parts of a focus adjustor that maneuvers a substrate in relation to calibration subsystem 200.

Calibration sensor 208, which can include one or more sensors, should have excellent focus accuracy and precision. More specifically, since one of the objects of the present invention is to improve focus accuracy of a focus system (e.g., primary focus system 100), calibration sensor 208 should have a higher focus accuracy than the primary control sensor (e.g., sensors 104 and 106) and the secondary control sensor (e.g., sensors 204 and 206). For example, calibration sensor 208 should produce more accurate absolute measurements of the location of (e.g., the distance to) a substrate's (e.g., wafer's) top surface than the primary and secondary control sensors, to thereby produce more accurate focal distance determinations.

According to a specific embodiment of the present invention, calibration sensor 208 includes one or more air gauges. In another embodiment of the present invention, calibration sensor 208 includes one or more optical gauges. In still another embodiment of the present invention, calibration sensor 208 includes one or more proximity probes (e.g., near field optical or atomic force probes).

Calibration sensor 208 and the primary and secondary control sensors should all have excellent repeatability. Since calibration sensor 208 is not being used in the immediate proximity of lens 108 (e.g., lens 108), calibration sensor 208 has relaxed space constraint requirements, relaxed bandwidth requirements, and relaxed operational environment requirements as compared to the primary control sensor (e.g., sensors 104 and 106), which is used in the immediate proximity of lens 108.

5. Operation of the Present Invention

Figure 3A:
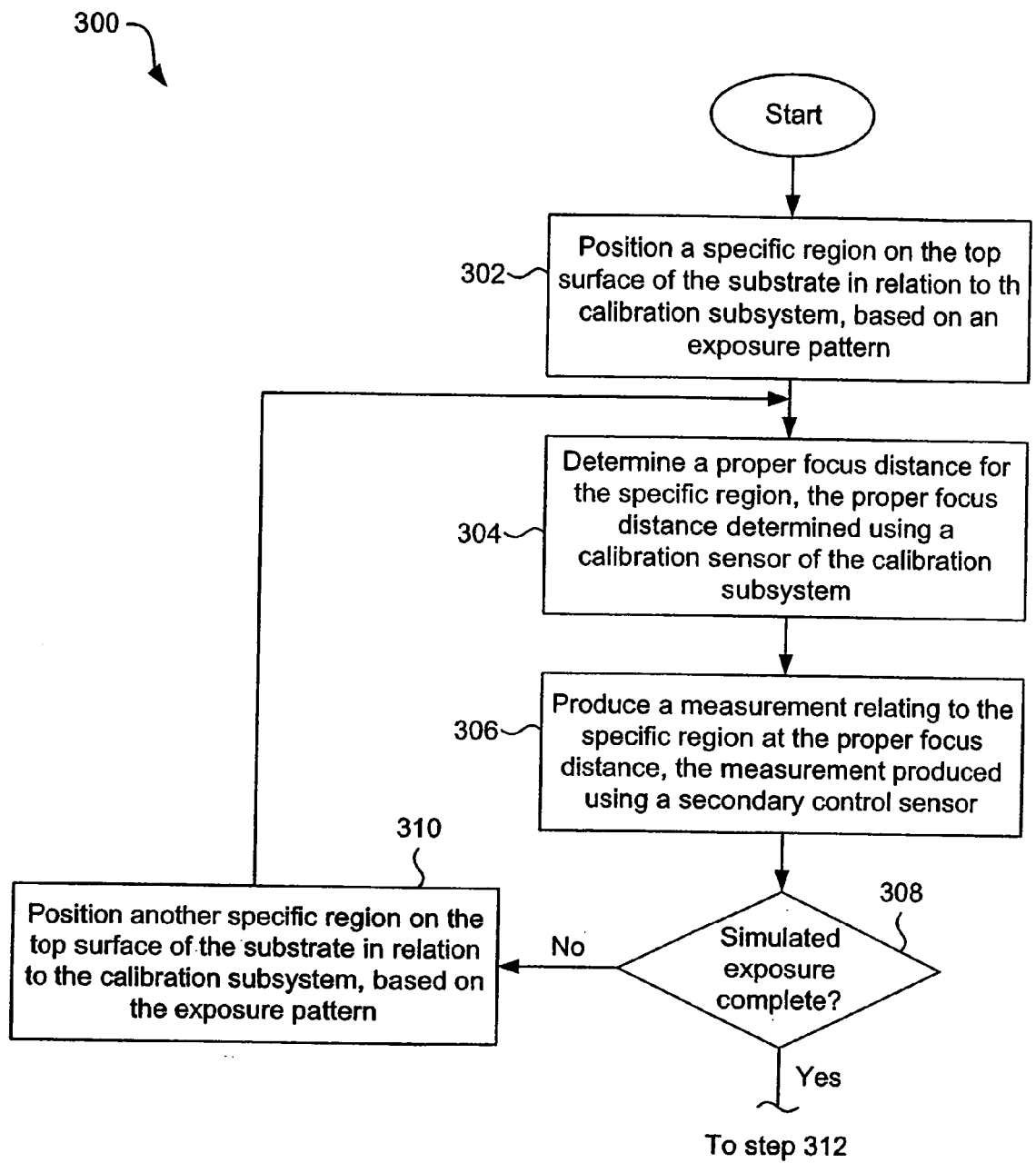
FIGS. 3A and 3B show a flowchart of a method for improving focus accuracy in a lithography system, according to an embodiment of the present invention.
Figure 3B:
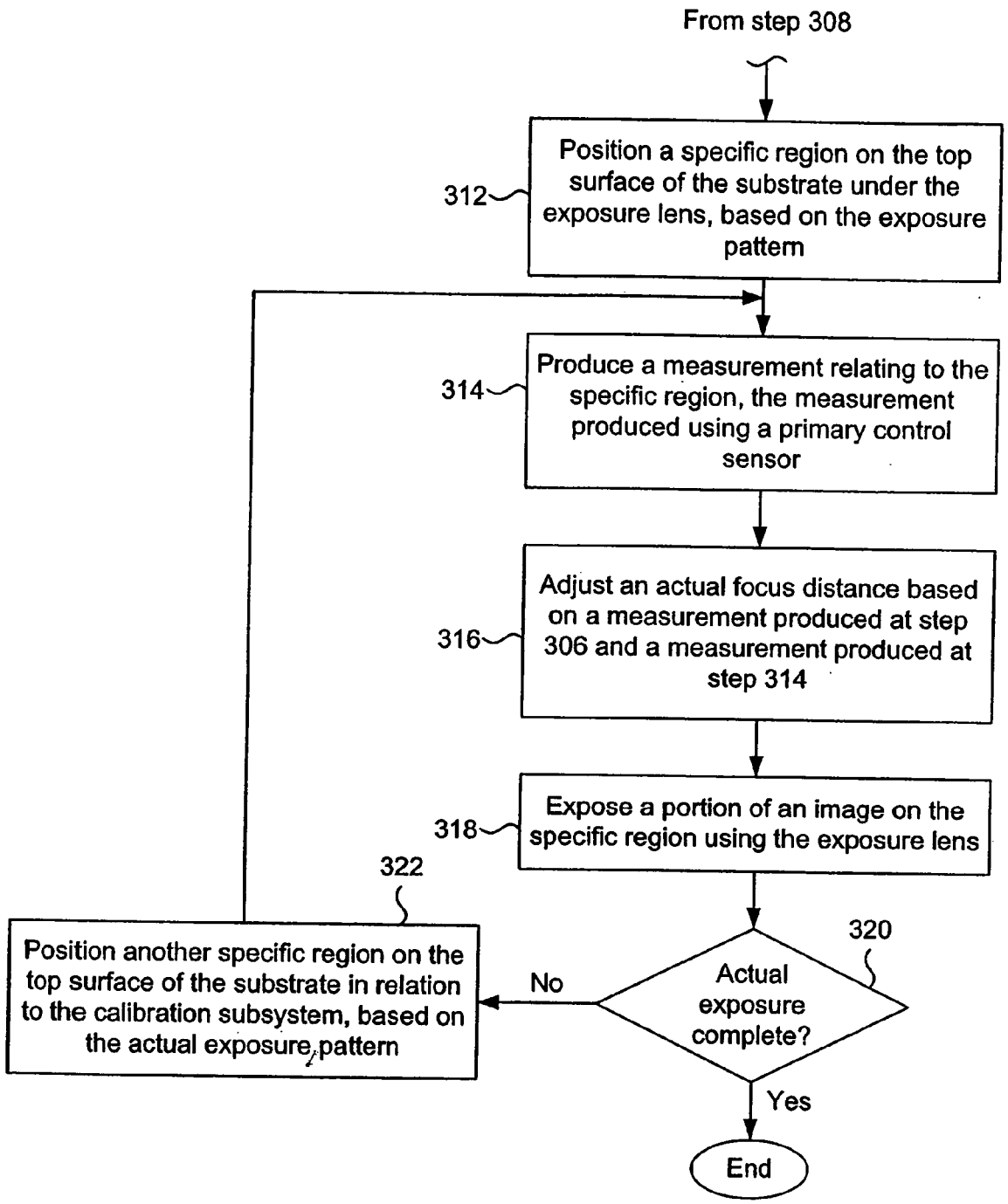

Components useful in practicing the present invention have been described above in the discussion of FIGS. 1 and 2. FIGS. 3A and 3B shall now be used to explain the operation of the present invention. Where applicable, reference is made to the components of FIGS. 1 and 2.

FIGS. 3A and 3B show a flowchart of a method 300, according to an embodiment of the present invention, for improving focus accuracy in a lithography system that includes a lens (e.g., lens 108) for exposing an image onto a top surface (e.g., surface 112) of a substrate (e.g., wafer 110) according to an exposure pattern. The exposure pattern refers to the order in which images are exposed onto regions of the top surface (e.g., surface 112) of a substrate (e.g., wafer 110).

Referring to FIG. 3A, the method begins at a step 302, when a specific region on a top surface (e.g., surface 112) of a substrate (e.g., wafer 110) is positioned in relation to calibration subsystem 200, based on an exposure pattern. For example, the specific region is positioned directly under calibration sensor 208.

Next, at a step 304, a proper focus distance for the specific region is determined using calibration sensor 208 of calibration subsystem 200. The proper focus distance can be determined by maneuvering wafer 110 until a focus error is reduced below an acceptable threshold. Alternatively, if calibration sensor 208 is operated within a linear operational range, the proper focus distance can be obtained without maneuvering wafer 110, as would be apparent to a person having ordinary skill in the relevant art. In the latter described embodiment, the secondary control sensor (e.g., sensors 204 and 206) should also be operated within a linear operational range. A linear operational range includes a range that is linearized through calibration.

Once the proper focus distance has been determined, a measurement relating to the specific region at the proper focus distance is produced, at a step 306, using the secondary control sensor (e.g., control sensors 204 and 206). The measurement relating to the specific region at the proper focus distance is then stored, for example, in an exemplary table 400 shown in FIG. 4.

Referring to FIG. 4, table 400 includes a region identification column 402, an optional calibration sensor value column 404, and one or more control sensor columns 406a–406n. Each row of region identification column 402a–402n identifies a region on the top surface of a substrate (e.g., in X/Y coordinates). A pattern will be exposed on these regions, based on an exposure pattern. Each row of calibration sensor value column 404 includes a value that calibration sensor 208 outputs when the corresponding region is at the proper focus distance. If calibration sensor 208 includes more than one sensor, then more than one value can be stored in each entry of column 404 (or additional calibration value sensor columns can be added). Each row of a control sensor column 406 includes a value that a particular control sensor outputs when the corresponding region is at the proper focus distance. For example, the values in column 406A relate to values that control sensor 204 output, and the values in column 406B relate to values that control sensor 206 output. Table 400 preferably includes a control sensor column relating to each control sensor (e.g., 204, 206) of the secondary control sensor. Use of table 400 will become more clear as the present invention is described in more detail.

According to one embodiment of the present invention, a specific region is moved to its proper focus distance prior to a measurement being produced at step 306. The proper focus distance is determined using calibration sensor 208. Then, the measurement produced at step 306 is an actual output of the secondary control sensor (e.g., control sensors 204 and 206) when the specific region is at the proper focus distance.

In an alternative embodiment, the specific region need not be moved to the proper focus distance prior to the measurement being produced at step 306. Rather, in this alternative embodiment, the measurement produced at step 306 corresponds to an output that the secondary control sensor predictively should produce when the specific region is at the proper focus distance. This alternative embodiment is possible where outputs of secondary control sensor are predictable (e.g., the outputs produce a linear function). For example, assume a focus distance for the specific region is determined using calibration sensor 208, and it is determined that the specific region is out of focus by 10 nm. The output of the secondary control sensor can accordingly be adjusted, such that the measurement produced at step 306 is the output that the secondary control sensor (e.g., sensors 204 and 206) would produce if the specific region were at the proper focus distance.

Returning to FIG. 3A, at a next step 308, there is a determination whether a simulated exposure of the substrate is complete. If not (i.e., if the answer to step 308 is NO), then another specific region on the top surface of the substrate is positioned in relation to the calibration to calibration subsystem 200. Steps 304 and 306 are then performed for the current specific region, and another measurement is produced using the secondary control sensor (e.g., sensors 204 and 206) and stored (e.g., in table 400). Steps 304, 306, 308 and 310 are repeated until the entire exposure pattern is simulated (causing the answer to step 308 to be YES). During this simulation of the exposure pattern, a measurement relating to each of the regions to be exposed is produced (at step 306) and stored (e.g., in table 400). Steps 302 through 310 all occurred at a location remote from (e.g., off axis from) lens 108 of primary focus system 100. Thus, during steps 302 though 310, primary focus system 100 could be exposing other substrates. That is, primary focus system 100 need not be idle while the steps associated with calibration subsystem 200 are being performed.

The remaining steps of method 300 (i.e., 312 through 322) occur when substrate 110 is positioned in relation to primary focus system 100.

Referring now to FIG. 3B, at a next step 312, a specific region on the top surface (e.g., surface 112) of the substrate (e.g., wafer 110) is positioned under lens 108, in accordance with the exposure pattern. For example, referring to table 400, the specific region associated with coordinates X1/Y1 is positioned under lens 108.

While positioned under the lens, at a step 314, a measurement relating the specific region is produced using the primary control sensor (e.g., sensors 104 and 106).

Then, at a step 316, the actual focus distance between lens 108 and the specific region on the surface of the substrate is adjusted, based on the measurements made at step 306 and 314 that correspond to that specific region. For example, at step 312, the substrate can be adjusted based on the difference between a measurement produced at step 306 using the secondary control sensor (e.g., sensors 204 and 206) and a corresponding measurement produced at step 314 using the primary control sensor (e.g., sensors 104 and 106). Assuming the specific region under lens 108 is associated with coordinate X1/Y1, a difference between the measurement produced at step 306 (corresponding to coordinates X1/Y1) and the measurement produced at step 308 (corresponding to the same coordinates X1/Y1) is calculated using the appropriate values stored in table 400 (e.g., Control A1,1 and Control B1,1) and the values presently being output by the primary control sensor (e.g., sensors 104 and 106). Similarly, at step 312, the substrate can be adjusted until the outputs of the primary controls sensor (e.g., sensors 104 and 106) are equal to the corresponding measurement stored in table 400.

Once the specific region is adjusted such that it is at the proper focus distance, a portion of an image is exposed on the top surface of the substrate using the exposure lens 108, at a step 318.

At a next step 320, there is a determination whether the exposure of the image onto the entire surface of the substrate is complete. If not (i.e., if the answer to step 320 is NO), then another specific region on the top surface of the substrate is positioned in relation to the calibration to primary focus system 100. Steps 314, 316 and 318 are then performed for the current specific region, and another portion of the image is exposed on the top surface of the substrate at step 318. Steps 314, 316, 318, 320 and 322 are repeated until the entire exposure pattern is completed (causing the answer to step 320 to be YES). During this actual exposure of in image onto a substrate, a measurement relating to each of the regions to be exposed is produced (at step 314), focus distances are adjusted (at step 316) and portions of the image are exposed (at step 320).

The above described method 300 and system of the present invention can be used to achieve the requirements associated with next generation lithography systems. As discussed above, this is accomplished by using calibration subsystem 100 to relieve primary focus system 100 of some of the requirements.

The above described method 300 and system of the present invention has been described such that the same substrate used for calibration (i.e., in steps 302–310) is the same substrate upon which an image is exposed (i.e., in steps 312–320). Accordingly, in one embodiment of the present invention, steps 302–310 and steps 312–320 are performed for each substrate (e.g., wafer). However, in an alternative embodiment of the present invention, steps 302–310 are performed using only one substrate (or a few substrates) for calibration, and an image is then exposed on other substrates (i.e., in steps 312–320) using the calibration that was based on the one substrate (or the few substrates). Such other substrates can be different wafers. Such other substrates can be other fields on the same wafer. For example, if a wafer includes fifty fields that should include the same features, steps 302–310 are performed using one or two of the fields (if performed for a plurality of fields, an average calibration is determined). Then, the calibration performed using the one or two fields (i.e., in steps 302–310) are used when exposing images on each of the fifty fields. This alternative embodiment is more time efficient, because calibration may take as much or more time than exposure. However, this alternative embodiment is probably not as accurate or precise as the embodiment where calibration and exposure are preformed for each substrate.

Although the present invention has been primarily described in reference to an optical lithography system, it is equally applicable to other types of systems. For example, as mentioned above, instead of projecting an optical beam, exposing area 108 can project an electron beam, as in an X-ray lithography system. Alternatively, exposing area 108 can project a shadow, e.g., in a lithography system utilizing a contact print.

6. Control System Implementation

As discussed above, features of the present invention can be performed using the elements described in connection to the figures. It is further noted that specific features of the present invention can be controlled by a computer system. Such a computer system can includes, for example, one or more processors that are connected to a communication bus. The computer system can also include a memory, preferably a random access memory (RAM), and can also include a secondary memory. Table 400 can be stored in one of the memory devices.

The secondary memory can include, for example, a hard disk drive and/or a removable storage drive, representing a floppy disk drive, a magnetic tape drive, an optical disk drive, and the like. The removable storage drive reads from and/or writes to a removable storage unit in a well known manner. The removable storage unit, represents a floppy disk, magnetic tape, optical disk, and the like, which is read by and written to by the removable storage drive. The removable storage unit includes a computer usable storage medium having stored therein computer software and/or data. The secondary memory can include other similar means for allowing computer programs or other instructions to be loaded into the computer system. Such means can include, for example, a removable storage unit and an interface. Examples of such can include a program cartridge and cartridge interface (such as that found in video game devices), a removable memory chip (such as an EPROM, or PROM) and associated socket, and other removable storage units and interfaces which allow software and data to be transferred from the removable storage unit to the computer system. The computer system can also include a communications interface. The communications interface allows software and data to be transferred between the computer system and external devices.

In another embodiment, features of the invention are implemented primarily in hardware using, for example, hardware components such as application specific integrated circuits (ASICs). Implementation of the hardware state machine so as to perform the functions described herein will be apparent to persons skilled in the relevant art(s). In yet another embodiment, features of the invention can be implemented using a combination of both hardware and software.

7. Conclusion

While various embodiments of the present invention have been described above, it should be understood that they have been presented by way of example, and not limitation. It will be apparent to persons skilled in the relevant art that various changes in form and detail can be made therein without departing from the spirit and scope of the invention.

The present invention has been described above with the aid of functional building blocks illustrating the performance of specified functions and relationships thereof. The boundaries of these functional building blocks have been arbitrarily defined herein for the convenience of the description. Alternate boundaries can be defined so long as the specified functions and relationships thereof are appropriately performed. Any such alternate boundaries are thus within the scope and spirit of the claimed invention. One skilled in the art will recognize that certain functional building blocks can be implemented by discrete components, application specific components, processors executing appropriate software and the like or any combination thereof. Thus, the breadth and scope of the present invention should not be limited by any of the above-described exemplary embodiments, but should be defined only in accordance with the following claims and their equivalents.

What is claimed is:

1. A system for improving focus accuracy in a lithography system, comprising:
   a calibration sensor having relatively high focus accuracy;
   a secondary control sensor having relatively low focus accuracy, wherein the focus accuracy of the secondary control sensor is related to the focus accuracy of the calibration sensor by a calibration value;
   a primary control sensor having substantially the same focus accuracy as the secondary control sensor and configured to measure a focal distance to a surface of a substrate; and
   a focal adjustment system configured to determine an actual focal distance of the surface of the substrate based on the focal distance measured by the primary control sensor and the calibration value and adjust a position of the substrate based on the actual focal distance.

2. The system of claim 1, wherein the secondary control sensor and the primary control sensor are distinct sensors that are substantially identical to each other.

3. The system of claim 1, wherein the calibration sensor and the secondary control sensor are located in a calibration area of the lithography system, and wherein the primary control sensor is located in an exposing area of the lithography system.

4. The system of claim 3, further comprising a substrate positioner configured to position the substrate under the exposing area of the lithography system.

5. The system of claim 3, wherein the exposing area comprises a lens.

6. The system of claim 3, wherein the exposing area projects an electron beam.

7. The system of claim 3, wherein the exposing area projects a shadow.

8. The system of claim 1, wherein the calibration sensor comprises at least one air gauge.

9. The system of claim 1, wherein the secondary control sensor comprises at least one capacitance gauge, and wherein the primary control sensor is substantially identical to the secondary control sensor.

10. The system of claim 1, wherein the calibration sensor comprises at least one optical gauge.

11. A system for positioning a substrate for exposure in a lithography system, comprising:
   a calibration subsystem configured to position the substrate at a proper focal distance to a surface of the substrate, the calibration system comprising:
     a relatively high accuracy calibration sensor configured to determine the proper focal distance to the surface of the substrate; and
     a relatively low accuracy secondary sensor configured to measure the focal distance to the surface of the substrate when the substrate is positioned at the proper focal distance; and
   a control subsystem configured to position the substrate at a proper focal distance under an exposure area of the lithography system, the control subsystem comprising:
     a primary sensor having substantially the same accuracy as the secondary sensor and configured to measure the proper focal distance to the surface of the substrate based on the focal distance measured by the secondary sensor.

12. The system of claim 11, wherein the control subsystem is further configured to position additional substrates under the exposure area of the lithography system based on the focal distance measured by the secondary sensor.

13. The system of claim 12, wherein:
the calibration subsystem is further configured to position additional substrates at a proper focal distance to a surface of each additional substrate.

14. The system of claim 11, wherein the secondary sensor and the primary sensor are substantially identical to one another.

15. The system of claim 11, wherein the calibration system is positioned at a location remote from the exposure area.

16. The system of claim 11, wherein the exposure area comprises a lens.

17. The system of claim 11, wherein the exposure area projects an electron beam.

18. The system of claim 11, wherein the exposure area projects a shadow.

19. The system of claim 11, wherein the calibration sensor comprises at least one air gauge.

20. The system of claim 11, wherein the secondary control sensor comprises at least one capacitance gauge, and wherein the primary control sensor is substantially identical to the secondary control sensor.

* * * * *